(12) United States Patent
Hong et al.

(10) Patent No.: US 9,818,975 B2
(45) Date of Patent: Nov. 14, 2017

(54) ORGANIC LIGHT-EMITTING DISPLAY APPARATUS FOR INCREASING CONTACT AREA BETWEEN SEALING MEMBER AND INSULATING LAYERS

(71) Applicant: Samsung Display Co., Ltd., Yongin-si, Gyeonggi-do (KR)

(72) Inventors: Sangmin Hong, Yongin-si (KR); Jungi Youn, Yongin-si (KR); Goeun Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/007,923

(22) Filed: Jan. 27, 2016

(65) Prior Publication Data

US 2016/0293883 A1  Oct. 6, 2016

(30) Foreign Application Priority Data

Apr. 3, 2015  (KR) ........................ 10-2015-0047542

(51) Int. Cl.
*H01L 27/32* (2006.01)
*H01L 51/52* (2006.01)

(52) U.S. Cl.
CPC ...... *H01L 51/5246* (2013.01); *H01L 27/3258* (2013.01); *H01L 27/3276* (2013.01); *H01L 2251/5392* (2013.01)

(58) Field of Classification Search
CPC . H01L 27/32; H01L 27/3202; H01L 27/3204; H01L 27/3209; H01L 27/3225; H01L 27/3251; H01L 27/3258; H01L 2227/32; H01L 2924/12044
See application file for complete search history.

(56) References Cited

U.S. PATENT DOCUMENTS

| | | |
|---|---|---|
| 2005/0184927 A1 | 8/2005 | Kwak |
| 2010/0102719 A1 | 4/2010 | Lee et al. |
| 2011/0057208 A1 | 3/2011 | Jeon et al. |
| 2012/0074838 A1 | 3/2012 | Im et al. |
| 2012/0235557 A1 | 9/2012 | Lee |
| 2013/0026505 A1 | 1/2013 | Lee et al. |
| 2014/0132149 A1 | 5/2014 | Song et al. |

(Continued)

FOREIGN PATENT DOCUMENTS

| | | |
|---|---|---|
| KR | 10-2005-0081541 A | 8/2005 |
| KR | 10-2010-0047585 A | 5/2010 |

(Continued)

*Primary Examiner* — Hoai V Pham
(74) *Attorney, Agent, or Firm* — Knobbe Martens Olson & Bear LLP

(57) ABSTRACT

An organic light-emitting display apparatus includes a first substrate including a display area and a peripheral area; a second substrate opposing the first substrate; an insulating layer disposed on the first substrate and including one or more openings; and a sealing member interconnecting the first substrate and the second substrate to each other and interposed between the first and second substrates. The one or more openings are disposed between a first conductive layer disposed on the display area and a second conductive layer disposed on the peripheral area. The one or more openings are at least partially or entirely filled with the sealing member.

19 Claims, 6 Drawing Sheets

(56) References Cited

U.S. PATENT DOCUMENTS

| | | | |
|---|---|---|---|
| 2015/0236297 A1 | 8/2015 | Hong et al. | |
| 2016/0276620 A1* | 9/2016 | Hong | H01L 51/5243 |
| 2016/0285042 A1* | 9/2016 | Choi | H01L 51/5246 |

FOREIGN PATENT DOCUMENTS

| | | |
|---|---|---|
| KR | 10-2011-0027115 A | 3/2011 |
| KR | 10-2012-0032250 A | 4/2012 |
| KR | 10-2012-0105252 A | 9/2012 |
| KR | 10-2013-0014367 A | 2/2013 |
| KR | 10-2014-0061095 A | 5/2014 |
| KR | 10-2015-0098284 A | 8/2015 |

\* cited by examiner

FIG. 4
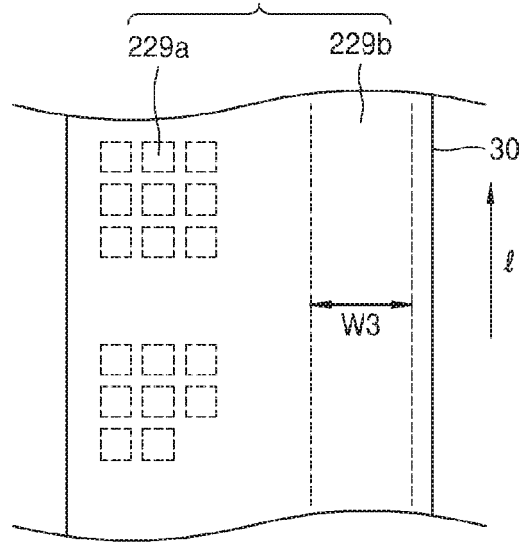
FIG. 5
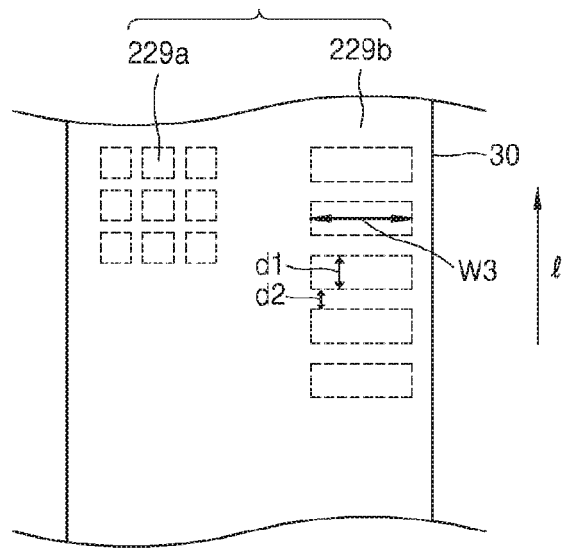
FIG. 6
| FORCE (kgf) | COMPARATIVE EXAMPLE | FIRST EMBODIMENT | SECOND EMBODIMENT |
|---|---|---|---|
| MINIMUM | 4.59 | 4.39 | 5.86 |
| MAXIMUM | 6.35 | 6.79 | 7.11 |
| DEVIATION | 0.42 | 0.55 | 0.39 |
| AVERAGE | 5.84 | 6.04 | 6.58 |

ORGANIC LIGHT-EMITTING DISPLAY APPARATUS FOR INCREASING CONTACT AREA BETWEEN SEALING MEMBER AND INSULATING LAYERS

RELATED APPLICATION

This application claims the benefit of Korean Patent Application No. 10-2015-0047542, filed on Apr. 3, 2015, in the Korean Intellectual Property Office, the disclosure of which is incorporated herein in its entirety by reference.

BACKGROUND

1. Field

One or more embodiments relate to an organic light-emitting display apparatus.

2. Discussion of the Related Technology

A display apparatus is used to provide a user with visual information such as images or videos. Such a display apparatus is being manufactured in various types in order to display visual information, that is, images or videos.

In particular, an organic light-emitting display apparatus is a self-emissive display apparatus that emits light by electrically exciting an organic compound. Therefore, the organic light-emitting display apparatus may operate with a low voltage and may be manufactured to be thin, and thus, may have wide viewing angles and fast response speeds. Accordingly, the organic light-emitting display apparatus has been considered as a next generation display apparatus capable of addressing the problems of a liquid crystal display (LCD) apparatus.

In such an organic light-emitting display apparatus, a sealing member may be used to bond a lower substrate and an upper substrate to each other. A portion where the sealing member is located becomes a dead space that may not display images.

In general, in the organic light-emitting display apparatus, an area occupied by the sealing member that is used to bond the lower substrate and the upper substrate to each other, that is, a dead space, is large.

SUMMARY

One aspect of the invention provides an organic light-emitting display apparatus, which may comprise: a first substrate comprising a display area and a peripheral area; a second substrate opposing the first substrate; an insulating layer disposed on the first substrate and comprising one or more openings; and a sealing member interconnecting the first substrate and the second substrate to each other and interposed the first substrate and the second substrate, wherein the one or more openings are disposed between a first conductive layer disposed on the display area and a second conductive layer disposed on the peripheral area, and the one or more openings are at least partly or entirely filled with the sealing member.

In the foregoing apparatus, the first conductive layer may be a power line disposed on the display area. The sealing member may contact the first conductive layer. The first conductive layer may be disposed at a different layer level than the second conductive layer. The first conductive layer may be disposed above the insulating layer, and the second conductive layer is disposed under the insulating layer. The first conductive layer and the second conductive layer may be formed of different materials from each other. At least one of the first conductive layer and the second conductive layer may comprise metal.

Still in the foregoing apparatus, the one or more openings may extend along a lengthwise direction of the sealing member when viewed in a viewing direction perpendicular to a major surface of the first substrate. The one or more openings may comprise first and second openings separate in a lengthwise direction of the sealing member when viewed in a viewing direction perpendicular to a major surface of the first substrate. A distance between the first and second openings may be less than a maximum width of each of the first and second openings. The one or more openings may be formed in one of a polygonal shape, a circular shape, and an oval shape.

Further in the foregoing apparatus, the apparatus may further comprise a transistor formed on the display area, wherein the first conductive layer comprises a material that is the same as a material forming at least one of a source electrode and a drain electrode of the transistor. The second conductive layer may comprise a material that is the same as a material forming a gate electrode of the transistor. A material that is the same as a material forming the first conductive layer may be disposed in at least one of the one or more openings. The sealing member may have a first width measured at its lower surface facing the first substrate and a second width measured at its upper surface facing the second substrate, the first width being different from the second width. The first width may be less than the second width. The insulating layer may comprise a material that is the same as a material forming an interlayer insulating layer formed on the display area.

Another aspect of the invention provides an organic light-emitting display apparatus, which may comprise: a first substrate comprising a display area and a peripheral area; a second substrate opposing the first substrate; an insulating layer disposed on the first substrate and comprising one or more openings; and a sealing member interconnecting the first substrate and the second substrate to each other and interposed between the first substrate and the second substrate, wherein at least one of the one or more openings is formed in a first conductive layer disposed on the display area, and the one or more openings are filled with the sealing member.

In the foregoing apparatus, the first conductive layer may be a power line of the display area. The apparatus may further comprise a second conductive layer disposed on the peripheral area, wherein the first conductive layer and the second conductive layer overlap each other.

One or more embodiments include an organic light-emitting display apparatus capable of reducing the isolation of a sealing member while reducing a dead space, and a method of manufacturing the organic light-emitting display apparatus.

One or more embodiments include an organic light-emitting display apparatus capable of improving a bonding force of a sealing member, and a method of manufacturing the organic light-emitting display apparatus.

Additional aspects will be set forth in part in the description which follows and, in part, will be apparent from the description, or may be learned by practice of the presented embodiments.

According to one or more embodiments, an organic light-emitting display apparatus includes: a first substrate including a display area and a peripheral area; a second substrate facing the first substrate; an insulating layer disposed on the first substrate and including one or more openings; and a sealing member for bonding the first substrate and the second substrate to each other, wherein the one or more openings are disposed between a first conductive layer disposed on the display area and a second conductive layer disposed on the peripheral area, and the sealing member fills the one or more openings.

The first conductive layer may be a power line of the display area.

The sealing member may contact the first conductive layer.

The first conductive layer may be disposed at a different layer level than the second conductive layer.

The first conductive layer may be disposed on the insulating layer, and the second conductive layer may be covered by the insulating layer.

The first conductive layer and the second conductive layer may be formed of different materials from each other.

At least one of the first conductive layer and the second conductive layer may include metal.

The one or more openings may be formed long in a lengthwise direction of the sealing member.

A plurality of the openings may be separate in the lengthwise direction of the sealing member.

A distance between neighboring openings from among the plurality of openings may be less than a maximum width of the plurality of openings.

The one or more openings may be formed in one of a polygonal shape, a circular shape, and an oval shape.

The display area may include a transistor, and the first conductive layer may include a material that is the same as a material forming at least one of a source electrode and a drain electrode of the transistor.

The second conductive layer may include a material that is the same as a material forming a gate electrode of the transistor.

A partial region in the one or more openings may include a material that is the same as a material forming the first conductive layer.

A width of a lower region in the sealing member may be different from a width of an upper region in the sealing member.

A width of a lower region in the sealing member may be less than a width of an upper region in the sealing member.

The insulating layer may include a material that is the same as a material forming an interlayer insulating layer on the display area.

According to one or more embodiments, an organic light-emitting display apparatus includes: a first substrate including a display area and a peripheral area; a second substrate facing the first substrate; an insulating layer disposed on the first substrate and comprising one or more openings; and a sealing member for bonding the first substrate and the second substrate to each other, wherein the one or more openings are formed in a first conductive layer disposed on the display area, and the sealing member fills the one or more openings.

The first conductive layer may be a power line of the display area.

The organic light-emitting display apparatus may further include a second conductive layer disposed on the peripheral area, wherein the first conductive layer and the second conductive layer partially overlap each other.

BRIEF DESCRIPTION OF THE DRAWINGS

These and/or other aspects will become apparent and more readily appreciated from the following description of the embodiments, taken in conjunction with the accompanying drawings in which:

FIG. 4 is a schematic plan view of a sealing member and an opening according to an embodiment;

FIG. 5 is a schematic plan view of a sealing member and an opening according to another embodiment;

FIG. 6 is a table showing results of experiments for isolating a display apparatus according to embodiments;

DETAILED DESCRIPTION

Figure 1:
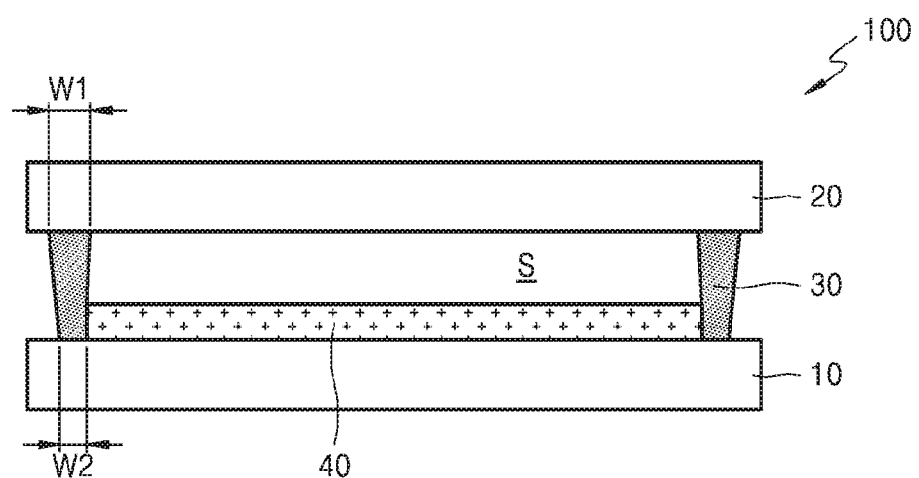
FIG. 1 is a schematic diagram of a display apparatus according to an embodiment.

Hereinafter, the inventive concept will be described more fully with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to one of ordinary skill in the art. Sizes of components in the drawings may be exaggerated for convenience of explanation. In other words, since sizes and thicknesses of components in the drawings are arbitrarily illustrated for convenience of explanation, the following embodiments are not limited thereto.

While such terms as "first," "second," etc., may be used to describe various components, such components must not be limited to the above terms. The above terms are used only to distinguish one component from another.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being formed or disposed "on" another layer, region, or component, it can be formed or disposed directly or indirectly on the other layer, region, or component. For example, one or more intervening layers, regions, or components may be present therebetween. As used herein, the term "and/or" includes any and all combinations of one or more of the associated listed items. Expressions such as "at least one of," when preceding a list of elements, modify the entire list of elements and do not modify the individual elements of the list.

In the embodiment, the display apparatus 100 is assumed as an organic light-emitting display apparatus, but is not limited thereto. The display apparatus 100 may be a display apparatus being applied a predetermined electric power to display images, e.g., a liquid crystal display (LCD) apparatus, a field emission display (FED) apparatus, or an electronic paper display (EPD) apparatus.

Figure 2:
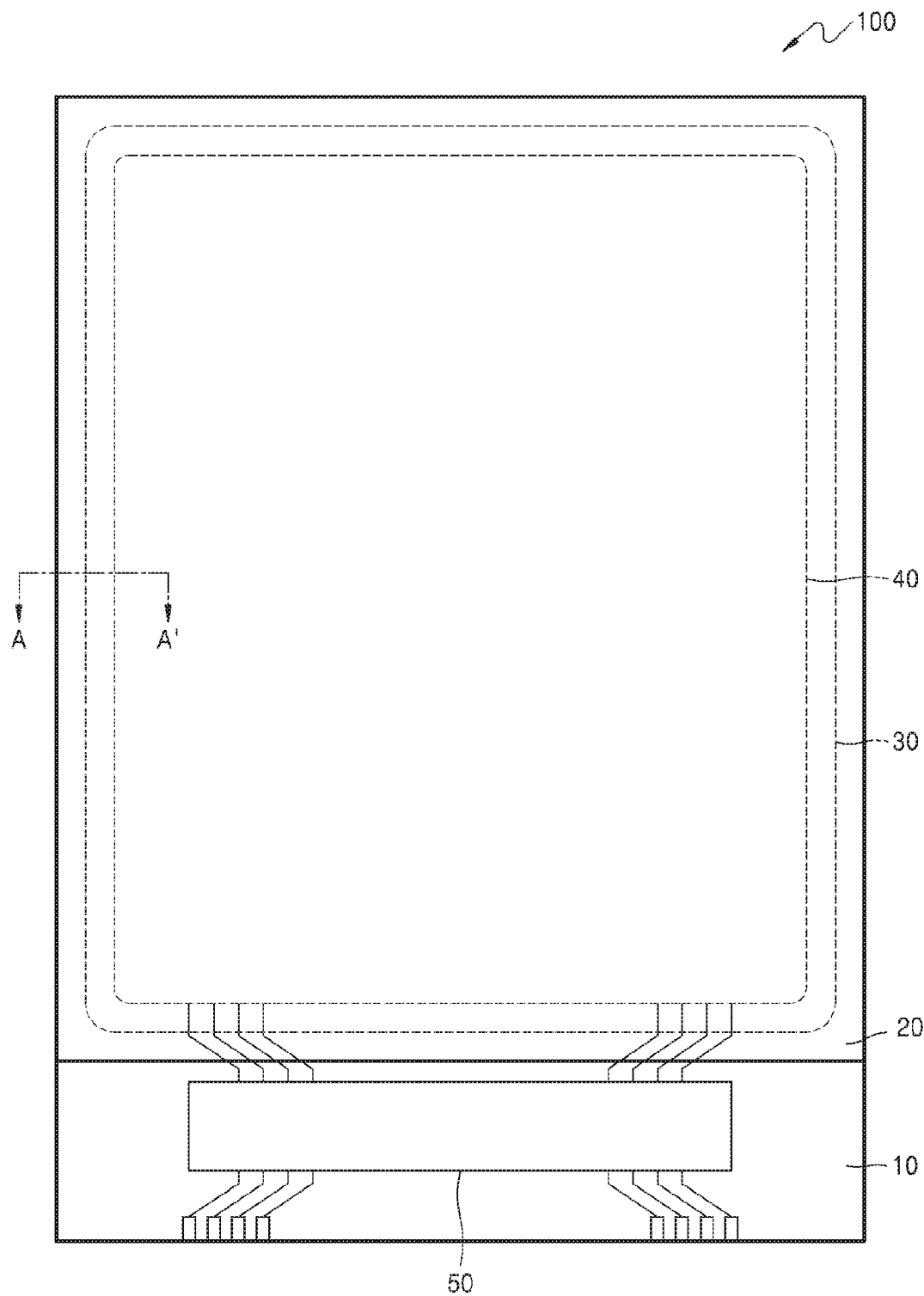
FIG. 2 is a schematic plan view of the display apparatus of FIG. 1.

FIG. 1 is a schematic diagram of a display apparatus 100 according to an embodiment, and FIG. 2 is a schematic plan view of the display apparatus 100 of FIG. 1.

Referring to FIGS. 1 and 2, the display apparatus 100 includes a first substrate or sheet 10, and a second substrate or sheet 20 arranged such that a lower surface of the second substrate 20 faces an upper surface of the first substrate 10. The apparatus 100 includes a display area 40, and a sealing member or seal member 30 surrounds the display area 40 when viewed in a viewing direction perpendicular to the upper surface of the first substrate 10 while bonding the first substrate 10 and the second substrate 20 to each other.

The first substrate 10 may be formed of a transparent glass material mainly containing $SiO_2$, but is not limited thereto. In an alternative embodiment, the first substrate 10 may be formed of a transparent plastic material. The first substrate 10 may be a flexible substrate. The flexible substrate may be formed of a material that is light, hard to be broken, and flexible due to a specific gravity that is greater than that of a glass substrate, for example, a polymer material such as a flexible plastic film.

The display area 40 may include thin film transistors TA and TB for driving, a capacitor Cst, and an organic light-emitting diode OLED on the first substrate 10. In embodiments, the display area may include a plurality of OLEDs forming an array. The display area 40 will be described in more detail later.

The second substrate 20 corresponds to the first substrate 10, and may be formed of various materials such as a glass material, a metal material, or a plastic material. In embodiments, a functional layer performing various functions may be formed on the second substrate 20. For example, the functional layer may include at least one selected from a polarization plate, a touch screen, and a cover window.

The touch screen may have a structure, in which a touch screen pattern is directly formed on the second substrate 20, for example, an on-cell touch screen panel. The polarization plate may prevent external light from being reflected by the display area 40. The cover window may protect the display apparatus 100.

The first substrate 10 and the second substrate 20 may be bonded to each other via the sealing member 30. The sealing member 30 is disposed to contact a part of the display area 40. The seal member 30 encapsulates the display area 40 from outside. Thus, the sealing member 30 may protect the display area 40 against the outside. A moisture absorbent or a filler may be disposed in an internal space S sealed by the first substrate 10, the second substrate 20, and the sealing member 30.

Since a part of the sealing member 30 contacts a part of the display area 40, a dead space generated due to the sealing member 30 may be reduced. Also, since the sealing member 30 and the display area 40 partially contact each other, an area of the display area 40 may be maintained while reducing the dead space.

A pad portion 50 may be mounted on an edge of the first substrate 10 that is not covered by the second substrate 20. Metal wires connecting the pad portion 50 to the display area 40 may be disposed between the first substrate 10 and the sealing member 30.

In addition, the sealing member 30 may be formed of a material that is melted when a predetermined thermal energy is applied thereto. The sealing member 30 may be melted by irradiating light. In embodiments, the sealing member 30 may include, for example, glass frit.

For example, after aligning the first substrate 10 and the second substrate 20 with each other, light such as an ultraviolet (UV) ray or a laser beam may be irradiated via the second substrate 20. The sealing member 30 is melted due to the irradiation of light, and then, the first substrate 10 and the second substrate 20 may be attached to each other. Since the sealing member 30 is compressed while being melted and solidified, a thickness of the sealing member 30 may be reduced.

In addition, a width w1 of an upper region of the sealing member 30 may be different from a width w2 of a lower region of the sealing member 30. For example, the width w1 of the upper region may be greater than the width w2 of the lower region in the sealing member 30. Therefore, when the width w2 of the lower region of the sealing member 30 is formed to be narrow, a short circuit of the display area 40, in particular, a circuit region, caused because the sealing member 30 pushes the display area 40, may be prevented.

In embodiments, the sealing member includes an upper surface facing the second substrate and a lower surface facing the first substrate. The width w1 may be measured at the upper surface and the width w2 may be measured at the lower surface. When reducing the width w2, a contact area between the lower surface and a surface that the lower surface contacts may be reduced. Thus, to provide sufficient contact area, in embodiments, the lower portion of the seal member 30 may include a plurality of protrusions received in holes and/or trenches. As described later, in embodiments, the display apparatus 100 according to the embodiment may include an insulating layer having a plurality of openings in order to reduce the width of the lower region of the sealing member 30, and the sealing member 30 may be filled in the plurality of openings.

Figure 3:
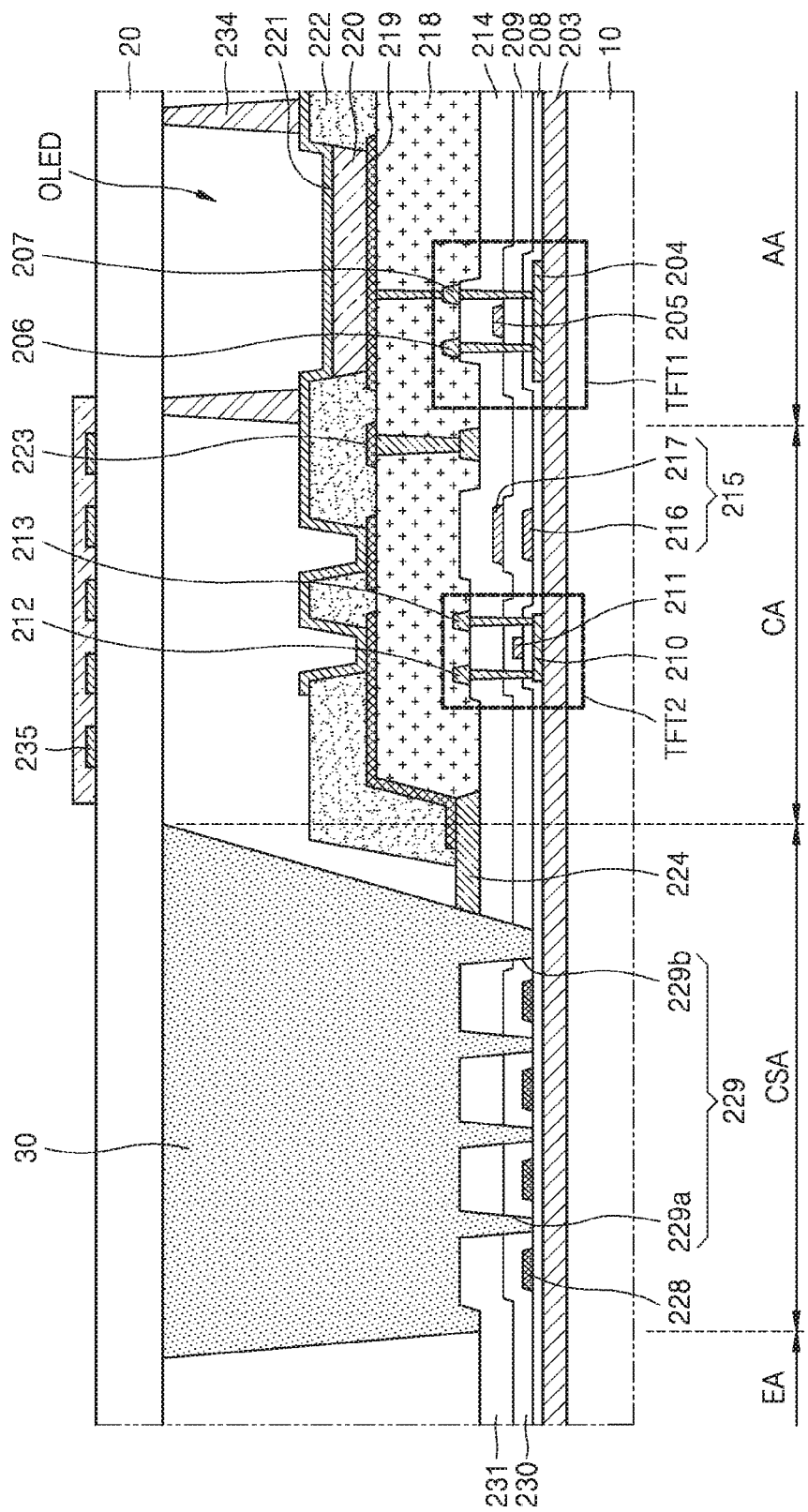
FIG. 3 is a cross-sectional view expanding a part of the display apparatus of FIG. 1.

FIG. 3 is a cross-sectional view expanding a part of the display apparatus 100 of FIG. 1.

The display apparatus may include an active area AA, and a circuit area CA extending from the active area AA toward a peripheral area. An edge area EA including a cutting region may be formed at the periphery. A cell seal area CSA is disposed between the active area AA and the edge area EA. The active area AA and the circuit area CA become a display unit, while the peripheral area includes the edge area EA and at least part of the cell seal area CSA.

The active area AA includes a region displaying images, and the circuit area CA includes a region where circuit patterns for electrically transmitting signals to devices of the active area AA are formed. In addition, the cell seal area CSA includes a region for bonding the first substrate 10 and the second substrate 20 to each other. In the display apparatus 100 according to the embodiment, the display unit may partially overlap the cell seal area CSA. In embodiments, a part of the display unit, for example, a part of the circuit area CA, may overlap a part of the cell seal area CSA. Therefore, the area of the display unit may not be reduced while reducing the dead space.

A buffer layer 203 is formed on the first substrate 10. The buffer layer 203 may planarize a surface of the first substrate 10, and prevent infiltration of moisture or external air into the first substrate 10. The buffer layer 203 may be formed as an inorganic layer such as silicon oxide, an organic layer such as polyimide, or a stacked structure of an inorganic layer and an organic layer.

At least one thin film transistor TFT is formed on each of the active area AA and the circuit area CA. A plurality of thin film transistors TFTs may be disposed on each of the active area AA and the circuit area CA. In the embodiment, different kinds of thin film transistors TFTs are disposed on the active area AA and the circuit area CA, but are not limited thereto.

A first thin film transistor TFT1 disposed on the active area AA may include a first semiconductor active layer 204, a first gate electrode 205, a first source electrode 206, and a first drain electrode 207. A first gate insulating layer 208 and a second gate insulating layer 209 are disposed between the first gate electrode 205 and the first semiconductor active layer 204 so as to insulate the first gate electrode 205 from the first semiconductor active layer 204.

A second thin film transistor TFT2 is disposed on the circuit area CA. The second thin film transistor TFT2 may include a second semiconductor active layer 210, a second gate electrode 211, a second source electrode 212, and a second drain electrode 213. The first gate insulating layer 208 is disposed between the second semiconductor active layer 210 and the second gate electrode 211 so as to insulate the second gate electrode 211 from the second semiconductor active layer 210.

When comparing the first thin film transistor TFT1 with the second thin film transistor TFT2, the first thin film transistor TFT1 further includes the second gate insulating layer 209 between a semiconductor active layer and a gate electrode. In embodiments, the first thin film transistor TFT1 has a gate insulating layer that is thicker than that of the second thin film transistor TFT2. If a thick gate insulating layer is provided, a driving range of a gate voltage applied to the gate electrode may become greater.

The first thin film transistor TFT1 may be a driving TFT for driving the organic light-emitting diode OLED. That the driving range of the driving thin film transistor becomes greater may denote controlling the light emitted from the organic light-emitting diode OLED to have a large gray scale.

The first gate electrode 205 and the second gate electrode 211 are not formed on the same layer. Therefore, even when the first thin film transistor TFT1 and the second thin film transistor TFT2 are disposed adjacent to each other, they do not interfere with each other. Thus, a lot of devices may be disposed on the same area.

The first semiconductor active layer 204 and the second semiconductor active layer 210 may be formed on the buffer layer 203. The first and second semiconductor active layers 204 and 210 may be formed of an inorganic semiconductor such as amorphous silicon or polysilicon, or an organic semiconductor.

According to the embodiment, the first semiconductor active layer 204 and the second semiconductor active layer 210 may be formed of an oxide semiconductor. For example, the oxide semiconductor includes an oxide of a material selected from Group VI, XII, XIII, and XIV metal elements such as zinc (Zn), indium (In), gallium (Ga), tin (Sn), cadmium (Cd), germanium (Ge), and hafnium (Hf), and combinations thereof.

The first gate insulating layer 208 is formed on the buffer layer 203, and covers the first semiconductor active layer 204 and the second semiconductor active layer 210.

The second gate electrode 211 is formed on the first gate insulating layer 208, and may overlap a part of the second semiconductor active layer 210.

The second gate insulating layer 209 covers the second gate electrode 211.

The first gate electrode 205 is formed on the second gate insulating layer 209, and may overlap a part of the first semiconductor active layer 204.

The first gate electrode 205 and the second gate electrode 211 may include a single layer or layers formed of Au, Ag, Cu, Ni, Pt, Pd, Al, Mo, and Cr, or an alloy such as Al:Nd or Mo:W.

The first gate insulating layer 208 and the second insulating layer 209 may include an inorganic layer such as silicon oxide, silicon nitride, or metal oxide. Each of the first gate insulating layer 208 and the second gate insulating layer 209 may be formed as a single layer or multiple sub-layers.

An interlayer insulating layer 214 is formed to cover the first gate electrode 205. The interlayer insulating layer 214 may be formed as an inorganic layer such as silicon oxide or silicon nitride. According to the embodiment, the interlayer insulating layer 214 may be formed as an organic layer such as polyimide.

The first source electrode 206 and the first drain electrode 207 are formed on the interlayer insulating layer 214, and contact the first semiconductor layer 204 via contact holes. Also, the second source electrode 212 and the second drain electrode 213 are formed on the interlayer insulating layer 214, and contact the second semiconductor active layer 210 via contact holes.

The first source electrode 206, the second source electrode 212, the first drain electrode 207, and the second drain electrode 213 may include metals, alloys, metal nitrides, conductive metal oxides, or transparent conductive materials.

The thin film transistor TFT is not limited to the above-described structure, and the thin film transistor TFT may have various types of structures. For example, the thin film transistor TFT is formed to have a top gate structure. However, the thin film transistor TFT may be formed to have a bottom gate structure, in which the first gate electrode 205 is disposed below the first semiconductor active layer 204.

A capacitor 215 may be formed on the circuit area CA. A plurality of capacitors may be formed on the active area AA.

The capacitor 215 includes a first capacitor electrode 216, a second capacitor electrode 217, and a second gate insulating layer 209 disposed between the first and second capacitor electrodes 216 and 217. The first capacitor electrode 216 may be formed of a material that is the same as the material forming the second gate electrode 211, and the second capacitor electrode 217 may be formed of a material that is the same as that forming the first gate electrode 205.

A planarization layer 218 covers the thin film transistors TFT1 and TFT2 and the capacitor 215. The planarization layer 218 is formed on the interlayer insulating layer 214. The planarization layer 218 eliminates steps on thin films and planarizes thin films in order to improve the light-emitting efficiency of the organic light-emitting diode OLED that will be formed thereon. According to the embodiment, the planarization layer 218 may have a through hole for exposing a part of the first drain electrode 207.

The planarization layer 218 may be formed of an insulating material. For example, the planarization layer 218 may be formed as a single-layered structure or a multi-layered structure including an inorganic material, an organic material, or an organic/inorganic composite material, by using various deposition methods.

The planarization layer 218 may be formed of an organic material such as polyacrylates resin, epoxy resin, or benzocyclobutene (BCB), or an inorganic material such as silicon nitride (SiNx).

One of the planarization layer 218 and the interlayer insulating layer 214 may be omitted.

The organic light-emitting diode OLED is formed on the planarization layer 218. The organic light-emitting diode OLED includes a first electrode 219, an intermediate layer 220 including an organic emission layer, and a second electrode 221.

A pixel-defining layer 222 covers the planarization layer 218 and a part of the first electrode 219, and defines a pixel area PA and a non-pixel area NPA.

The pixel-defining layer 222 may be formed of an organic material or an inorganic material. For example, the pixel-defining layer 222 may be formed of an organic material such as polyimide, polyamide, BCB, acryl resin, or phenol resin, or an organic material such as SiNx. The pixel-defining layer 222 may be formed to have a single-layered structure or a multi-layered structure.

Holes and electrons injected from the first electrode 219 and the second electrode 221 of the organic light-emitting diode OLED may be combined with each other in the organic emission layer of the intermediate layer 220 to emit light.

The intermediate layer 220 may include the organic emission layer. In another example, the intermediate layer 220 includes an organic emission layer and may further include at least one of a hole injection layer (HIL), a hole transport layer (HTL), an electron transport layer (ETL), and an electron injection layer (EIL). However, the embodiment is not limited thereto, and the intermediate layer 220 includes an organic emission layer and may further include other various functional layers.

The second electrode 221 may be formed on the intermediate layer 220. The second electrode 221 forms an electric field with the first electrode 219 to make the intermediate layer 220 emit light. The first electrode 219 may be patterned in each pixel, and the second electrode 221 may be on all the pixels as a common electrode so as to apply a common voltage to all the pixels.

The first electrode 219 and the second electrode 221 may include transparent electrodes or reflective electrodes.

The first electrode 219 functions as an anode, and may be formed of various conductive materials. The first electrode 219 may be formed as a transparent electrode or a reflective electrode.

For example, if the first electrode 219 is formed as a transparent electrode, the first electrode 219 includes a transparent conductive layer formed of indium tin oxide (ITO), indium zinc oxide (IZO), ZnO, or $In_2O_3$. If the first electrode 219 is formed as a reflective electrode, the first electrode 219 may be formed by forming a reflective layer by using Ag, Mg, Al, Pt, Pd, Au, Ni, Nd, Ir, Cr, or a compound thereof, and then, forming a transparent conductive layer by using ITO, IZO, ZnO, or $In_2O_3$ on the reflective layer.

The second electrode 221 may function as a cathode. Like the first electrode 219, the second electrode 221 may be formed as a transparent electrode or a reflective electrode.

For example, when the second electrode 221 is formed as a transparent electrode, metal having a small work function, for example, Li, Ca, LiF/Ca, LiF/Al, Al, Mg, or a compound thereof, is formed on the intermediate layer 220, and after that, a transparent conductive layer formed of ITO, IZO, ZnO, or $In_2O_3$ may be further formed on the metal and the compound thereof. When the second electrode 221 is formed as a reflective electrode, the second electrode 221 may be formed of Li, Ca, LiF/Ca, LiF/Al, Al, Mg, or a compound thereof.

The first electrode 219 may act as an anode and the second electrode 221 may act as a cathode, but they are not limited thereto. For example, the first electrode 219 may act as a cathode and the second electrode 221 may act as an anode.

Each organic light-emitting diode OLED may form one pixel, and each pixel may emit red, green, blue, or white light. However, one or more embodiments are not limited thereto. The intermediate layer 220 may be commonly formed on all the first electrodes 219 without regard to locations of the pixels. Here, the organic emission layer may be formed by, for example, stacking layers including light-emitting materials emitting red, green, and blue light vertically, or by mixing the light-emitting materials emitting red, green, and blue light. Provided that white light may be emitted, any type of color combinations may be used. A color conversion layer or a color filter for converting the white light into a predetermined color may be further provided.

A protective layer may be disposed on the second electrode 221. The protective layer covers the organic light-emitting diode OLED. The protective layer may be an inorganic insulating layer and/or an organic insulating layer.

A spacer 234 may be disposed on the non-pixel area NPA. The spacer 234 is disposed between the first substrate 10 and the second substrate 20. The spacer 234 may be provided not to degrade the display characteristics due to external shock.

The second substrate 20 is coupled onto the first substrate 10. The second substrate 20 may protect the organic light-emitting diode OLED and the other thin films against external moisture or oxygen.

The second substrate 20 may be a rigid glass substrate, a polymer substrate, or a flexible film. The second substrate 20 may have a structure, in which organic layers and inorganic layers are alternately stacked.

The second substrate 20 may include a plurality of touch electrodes 235 so as to perform as a touch screen. In addition, functional layers such as a polarization film, a color filter, and a cover window, may be further formed on the second substrate 20.

Various circuit patterns may be formed in the circuit area CA. Such circuit patterns may include, for example, a power supply line, an anti-electrostatic pattern, and other various electrically conductive material features may be formed.

A circuit wire 223 is formed on the circuit area CA. The circuit wire 223 may be formed on the planarization layer 218. The circuit wire 223 may be formed of the same material as that forming the first electrode 219. The circuit wire 223 may be electrically connected to a device on the active area AA, for example, the second electrode 221.

The circuit wire 223 is connected to a power line 224. The power line 224 may be formed on the interlayer insulating layer 214. The power line 224 may be formed of a material that is the same as that forming the first source electrode 206, the second source electrode 212, the first drain electrode 207, and the second drain electrode 213. The power line 224 may be a wire to which electric power is applied from outside. In the embodiment, the power line 224 may have a triple-layered structure including titanium (Ti)/aluminum (Al)/Ti. Since the power line 224 is formed of a conductive material, the power line 224 may be referred to as a conductive layer.

The circuit wire 223 and the power line 224 may be disposed at different layers.

For example, the circuit wire 223 may be formed on the polarization layer 218. The circuit wire 223 may be formed of the same material as the first electrode 219 in the same process as the first electrode 219. The power line 224 may be formed on the interlayer insulating layer 214. The power line 224 may be formed of the same material as those of the first source electrode 206, the second source electrode 212, the first drain electrode 207, and the second drain electrode 213 in the same process.

An end of the circuit wire 223 contacts the power line 224. In the embodiment, at least a part of the circuit wire 223 may overlap with the power line 224.

The sealing member 30 is disposed on the cell seal area CSA. The sealing member 30 is disposed between the first substrate 10 and the second substrate 20. A partial area of the sealing member 30 may be disposed along with a boundary of the circuit area CA while contacting the circuit area CA. For example, the partial area of the sealing member 30 may contact the power line 224.

The sealing member 30 includes glass frit. The glass frit includes glass powder and oxide powder. An organic material is added to the glass frit including the oxide powder to fabricate a gel-type paste, and baked in a temperature range of about 300° C. to 500° C. When baking the glass frit, the organic material is vapored to the atmosphere, and the gel-type paste is hardened to be the frit of a solid state.

A conductive material layer 228 may be formed below the sealing member 30. The conductive material layer 228 may absorb the heat of the laser beam or reflect the laser beam to transfer the heat to the sealing member 30. In embodiments, the reflective, conductive material layer 228 may be electrically decoupled from any electronic features formed over the display area.

The conductive material layer 228 may be formed of the same material and at the same layer as the second gate electrode 211 in the second thin film transistor TFT2. Otherwise, the conductive material layer 228 may be formed of the same material and at the same layer as the first gate electrode 205 in the first thin film transistor TFT1.

The conductive material layer 228 may have a single-layered structure or a multi-layered structure including Au, Ag, Cu, Ni, Pt, Pd, Al, Mo, or Cr. The conductive material layer 228 may be formed of an alloy such as Al:Nd or Mo:W.

At least one insulating layer, for example, a first insulating layer 230 and a second insulating layer 231, are formed on the conductive material layer 228. When the first insulating layer 230 and the second insulating layer 231 are formed on the conductive material layer 228, a hillock phenomenon and generation of pores caused by rapid temperature rising of the conductive material layer 228 due to the laser beam may be prevented.

The first insulating layer 230 and the second insulating layer 231 include a plurality of openings 229. The plurality of openings 229 may be provided in order to increase a contact area between the sealing member 30 and the first and second insulating layers 230 and 231. Accordingly, a bonding strength between the sealing member 30 and the first and second insulating layers 230 and 231 may be improved. In embodiments, the openings 229 may include holes and/or trenches formed in the insulation layers 230 and 231. The openings 229 may be filled with the seal material for forming portions of the seal member 30.

The first insulating layer 230 may be formed of the same material and at the same layer as the second gate insulating layer 209. The second insulating layer 231 may be formed of the same material and at the same layer as the interlayer insulating layer 214.

The plurality of openings 229 may include a first opening 229*a* disposed between the conductive material layers 228, and a second opening 229*b* disposed between the conductive material layer 228 and the display area, for example, the circuit area CA. Since the sealing member 30 is filled in the first and second openings 229*a* and 229*b*, a contact area between the sealing member 30 and the first and second insulating layers 230 and 231 may be increased. Therefore, a bonding intensity between the sealing member 30 and the first and second insulating layers 230 and 231 may be improved.

In particular, the second opening 229*b* is formed to be adjacent to the power line 224 so that the sealing member 30 may contact the power line 224 while filling the second opening 229*b*. Thus, the display apparatus 100 may have a bonding strength that is greater than that between the sealing member 30 and the first and second insulating layers 230 and 231 due to the first opening 229*a*. Also, if there are impurities under the sealing member 30, the impurities may flow through the second opening 229*b*, and thus, the impurities may not push the structures in the display area 40.

As shown in FIG. 3, in embodiments, the seal member 30 includes a top inner edge and a bottom inner edge. When viewed in the viewing direction perpendicular to a top surface of the first substrate 10, the top inner edge is located closer to the active area AA than the bottom inner edge. Thus, an inner side wall of the seal member 30 is inclined such that an angle between the top surface of the first substrate in the display area and the side wall is smaller than 90°. Accordingly, in embodiments, when viewed in the viewing direction, the seal member 30 overlaps structures in the display area, for example, the power line 224 and/or the pixel defining layer as shown in FIG. 3.

FIG. 4 is a schematic plan view of the sealing member 30 and the openings 229. As shown in FIG. 4, the first and second insulating layers 230 and 231 may include the openings 229 that overlap with the sealing member 30. The openings 229 may include the first opening or holes 229*a* disposed between the conductive material layers and the second opening or trench 220*b* that is adjacent to the display area.

There may be a plurality of first openings 229*a* that are arranged two dimensionally. A size of the first opening 229*a*, for example, a width of the first opening 229*a*, may be 3 μm, and a distance between the first openings 229*a* may be about 2.5 μm or greater. If the distance between the first openings 229*a* is less than 2.5 μm, the first and second insulating layers 230 and 231 between adjacent first openings 229*a* may be collapsed to form one opening. In this case, the contact area between the sealing member 30 and the first and second insulating layers 230 and 231 may be reduced.

Here, the distance between the first openings 229*a* is not a distance between centers of the first openings 229*a*, but may be defined as a thickness of the first and second insulating layers 230 and 231 between the two adjacent first openings 229*a*. A cross-sectional shape of the first opening 229*a* may be a square shape, but is not limited thereto. In an alternative embodiment, the cross-sectional shape of the first opening 229*a* may be a polygonal shape, a circular shape, or an oval shape.

One second opening 220*b* may be provided. The second opening or trench 229*b* is formed to be elongated in a length direction l of the sealing member 30 so as to surround at least a part of the display unit. A maximum width w3 of the second opening 229*b* may be about 16 μm. The second opening 229*b* has a greater width so that the contact area between the sealing member 30 and the first and second insulating layers 230 and 231 may be increased and the impurities existing under the sealing member 30 may flow through the second opening 229*b*, whereas the first opening 229*a* increases the contact area between the sealing member 30 and the first and second insulating layers 230 and 231. A cross-sectional shape of the second opening 229*b* may be a square shape, but is not limited thereto. In an alternative embodiment, the cross-sectional shape of the second opening 229b may be a polygonal shape, a circular shape, or an oval shape.

FIG. 5 is a schematic plan view of the sealing member 30 and the openings 229 according to another embodiment. When FIG. 5 is compared with FIG. 4, the openings 229 may include a plurality of second openings 229b that are adjacent to the display area 40. The plurality of second openings or holes 229b may be spaced apart from each other in the length direction I of the sealing member 30. The maximum width w3 of each of the second openings 229b may be greater than a maximum length dl of the second opening 229b. For example, the maximum width w3 of the second opening 229b may be about 16 μm and the maximum length d1 of the second opening 229b may be about 4.5 μm. Also, a distance d2 between the second openings 229b may be about 5 μm.

FIG. 6 is a table showing results of experimenting isolation of the display apparatus. As shown in FIG. 6, a comparative example, in which an insulating layer is formed on the first substrate, the first opening is formed in the insulating layer, and the first substrate and the second substrate are bonded to each other by the sealing member, a first example, in which an insulating layer is formed on the first substrate, and the first opening and the second opening of FIG. 4 are formed in the insulating layer, and the first substrate and the second substrate are bonded to each other by the sealing member, and a second example, in which an insulating layer is formed on the first substrate, the first opening and the second opening of FIG. 5 are formed in the insulating layer, and the first substrate and the second substrate are bonded to each other by the sealing member, were provided.

In addition, a force for isolating the first substrate and the second substrate from each other was applied. The first and second examples needed a greater force for isolating the first and second substrates from each other than that of the comparative example, and showed less standard deviation in the force than that of the comparative example. Also, the second example needed greater force than that of the first example for isolating the first and second substrates, and showed less standard deviation than that of the first example. Thus, it is considered that the isolation between the substrates has been improved when the second opening is formed adjacent to the display area.

Figure 7:
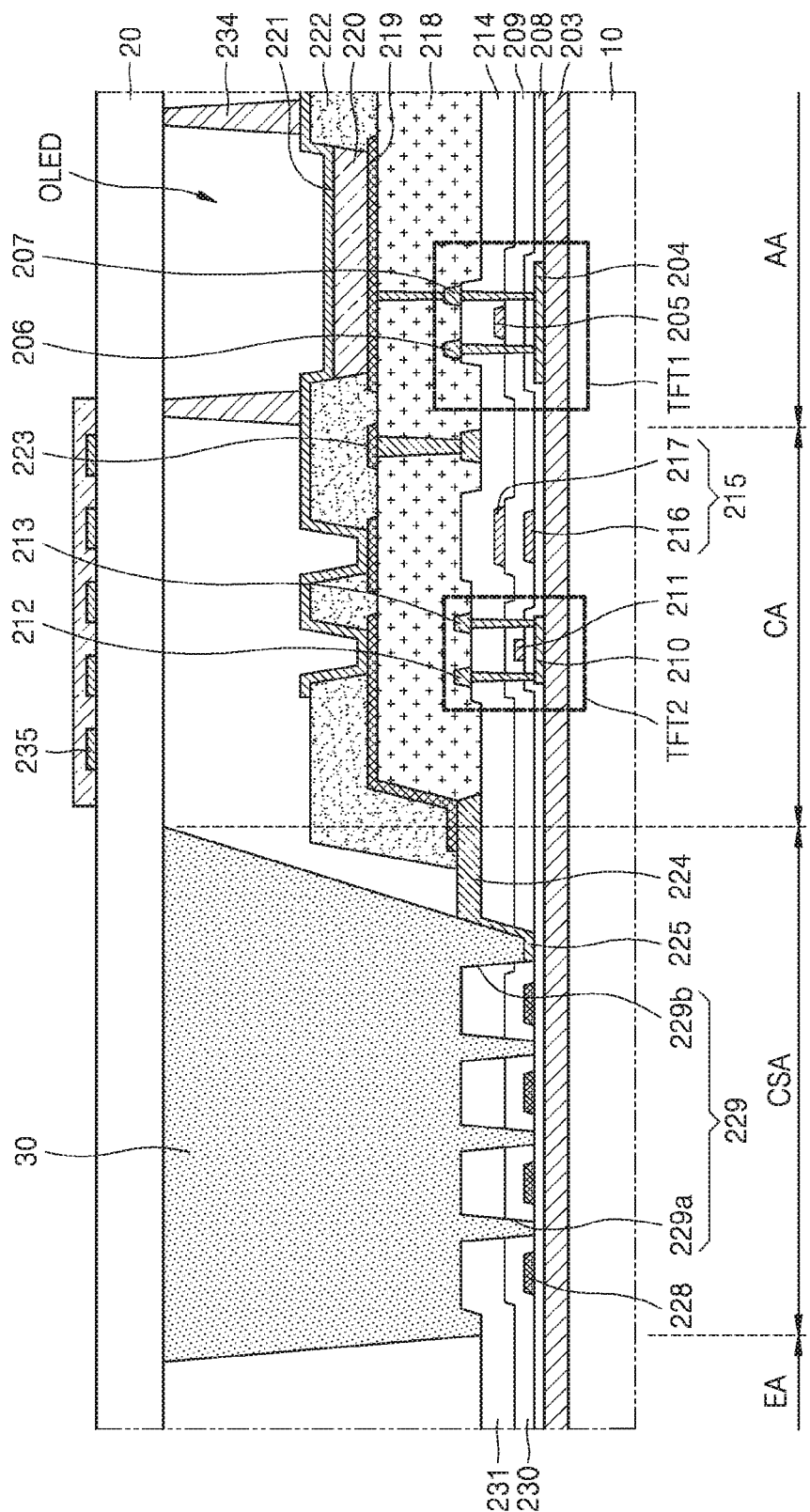
FIG. 7 is a cross-sectional view expanding a part of a display apparatus according to another embodiment.

FIG. 7 is a cross-sectional view expanding a part of the display apparatus 100 according to another embodiment. When comparing with the embodiment of FIG. 3, a metal material 225 is filled in a partial region in the second opening 229b. The metal material 225 may be the same as that of the power line 224. The metal material 225 may absorb the heat of the laser beam or reflect the laser beam to transfer heat to the sealing member 30. Therefore, attachment of the sealing member 30 may be reinforced.

Figure 8:
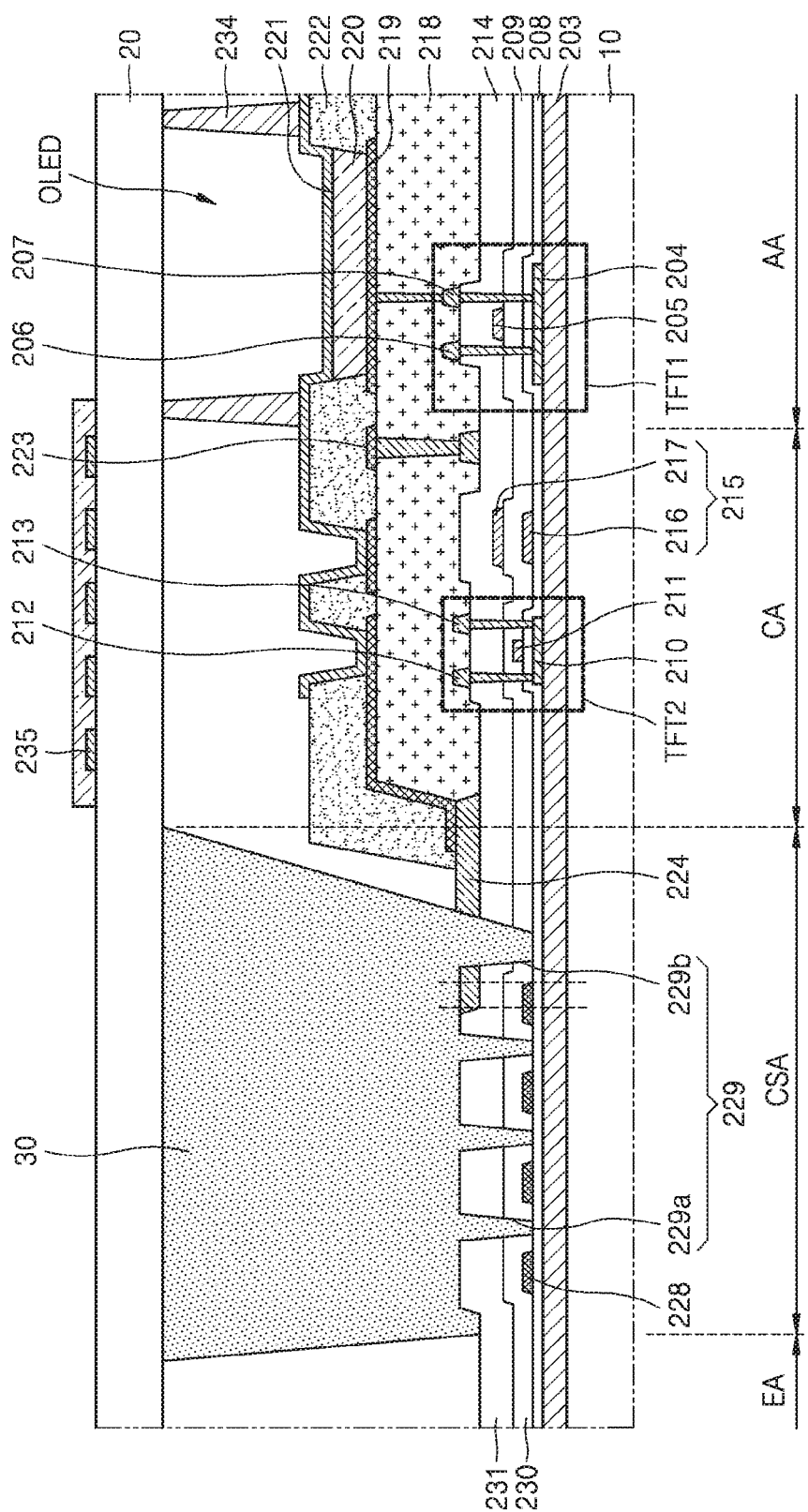
FIG. 8 is a cross-sectional view expanding a part of the display apparatus according to another embodiment.

FIG. 8 is a cross-sectional view expanding a part of the display apparatus 100 according to another embodiment. When comparing with the embodiment of FIG. 3, the second opening 229b of FIG. 8 may be formed in the power line 224. In addition, the power line 224 may partially overlap with the conductive material layer 228. Even though the power line 224 extends to the cell seal area CSA, the second opening 229b is disposed in the power line 224, and thus, the contact area between the sealing member 30 and the first and second insulating layers 230 and 231 may be increased. Therefore, the bonding strength between the sealing member 30 and the first and second insulating layers 230 and 231 may be improved.

It should be understood that the embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
   a first substrate comprising a display area and a peripheral area;
   a second substrate opposing the first substrate;
   an insulating layer disposed on the first substrate and comprising one or more openings; and
   a sealing member interconnecting the first substrate and the second substrate to each other and interposed between the first substrate and the second substrate,
   wherein the one or more openings are disposed between a first conductive layer disposed on the display area and a second conductive layer disposed on the peripheral area, and the one or more openings are at least partly or entirely filled with the sealing member, and
   wherein the sealing member contacts the first conductive layer.

2. The organic light-emitting display apparatus of claim 1, wherein the first conductive layer is a power line disposed on the display area.

3. The organic light-emitting display apparatus of claim 1, wherein the first conductive layer is disposed at a different layer level than the second conductive layer.

4. The organic light-emitting display apparatus of claim 1, wherein the first conductive layer is disposed above the insulating layer, and the second conductive layer is disposed under the insulating layer.

5. The organic light-emitting display apparatus of claim 1, wherein the first conductive layer and the second conductive layer are formed of different materials from each other.

6. The organic light-emitting display apparatus of claim 1, wherein at least one of the first conductive layer and the second conductive layer comprises metal.

7. The organic light-emitting display apparatus of claim 1, wherein the one or more openings extend along a lengthwise direction of the sealing member when viewed in a viewing direction perpendicular to a major surface of the first substrate.

8. The organic light-emitting display apparatus of claim 1, wherein the one or more openings comprise first and second openings separate in a lengthwise direction of the sealing member when viewed in a viewing direction perpendicular to a major surface of the first substrate.

9. The organic light-emitting display apparatus of claim 8, wherein a distance between the first and second openings is less than a maximum width of each of the first and second openings.

10. The organic light-emitting display apparatus of claim 1, wherein the one or more openings are formed in one of a polygonal shape, a circular shape, and an oval shape.

11. The organic light-emitting display apparatus of claim 1, further comprising a transistor formed on the display area, wherein the first conductive layer comprises a material that is the same as a material forming at least one of a source electrode and a drain electrode of the transistor.

12. The organic light-emitting display apparatus of claim 11, wherein the second conductive layer comprises a material that is the same as a material forming a gate electrode of the transistor.

13. The organic light-emitting display apparatus of claim 1, wherein a material that is the same as a material forming the first conductive layer is disposed in at least one of the one or more openings.

14. The organic light-emitting display apparatus of claim 1, wherein the sealing member has a first width measured at its lower surface facing the first substrate and a second width measured at its upper surface facing the second substrate, the first width being different from the second width.

15. The organic light-emitting display apparatus of claim 14, wherein the first width is less than the second width.

16. The organic light-emitting display apparatus of claim 1, wherein the insulating layer comprises a material that is the same as a material forming an interlayer insulating layer formed on the display area.

17. An organic light-emitting display apparatus comprising:
a first substrate comprising a display area and a peripheral area;
a second substrate opposing the first substrate;
an insulating layer disposed on the first substrate and comprising one or more openings; and
a sealing member interconnecting the first substrate and the second substrate to each other and interposed between the first substrate and the second substrate,
wherein at least one of the one or more openings is formed in a first conductive layer disposed on the display area, and the one or more openings are filled with the sealing member.

18. The organic light-emitting display apparatus of claim 17, wherein the first conductive layer is a power line of the display area.

19. The organic light-emitting display apparatus of claim 17, further comprising a second conductive layer disposed on the peripheral area,
wherein the first conductive layer and the second conductive layer overlap each other.

* * * * *